(12) United States Patent
An et al.

(10) Patent No.: US 9,021,693 B2
(45) Date of Patent: May 5, 2015

(54) METHOD OF MANUFACTURING PRINTED CIRCUIT BOARD WITH METAL BUMP

(75) Inventors: Jin Yong An, Daejeon (KR); Jae Joon Lee, Gyunggi-do (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 413 days.

(21) Appl. No.: 13/477,407

(22) Filed: May 22, 2012

(65) Prior Publication Data

US 2012/0231155 A1    Sep. 13, 2012

Related U.S. Application Data

(62) Division of application No. 12/382,360, filed on Mar. 13, 2009, now Pat. No. 8,207,450.

(30) Foreign Application Priority Data

Dec. 8, 2008   (KR) .................. 10-2008-0124154

(51) Int. Cl.
  *H01K 3/10*    (2006.01)
  *H05K 3/40*    (2006.01)
  *H01L 21/48*    (2006.01)
  *H01L 23/498*    (2006.01)
  *H05K 3/46*    (2006.01)
  (Continued)

(52) U.S. Cl.
  CPC ........... *H05K 3/4007* (2013.01); *H01L 21/4857* (2013.01); *H01L 23/49811* (2013.01); *H01L 23/49822* (2013.01); *H01L 2221/68345* (2013.01); *H05K 3/108* (2013.01); *H05K 3/205* (2013.01); *H05K 3/4682* (2013.01); *H05K 2201/0367* (2013.01); *H05K 2203/0228* (2013.01); *H05K 2203/0376* (2013.01); *H05K 2203/054* (2013.01); *H01L 2924/0002* (2013.01)

(58) Field of Classification Search
  CPC ..... H05K 3/4007; H05K 3/108; H05K 3/205; H05K 3/4682; H05K 2201/0367; H05K 2203/0228; H05K 2203/0376; H05K 2203/054; H01L 21/4857; H01L 23/49811; H01L 23/49822; H01L 2221/68346; H01L 2924/0002
  USPC ................. 29/825, 830, 846, 852; 174/259
  See application file for complete search history.

(56) References Cited

U.S. PATENT DOCUMENTS 3,594,493 A    7/1971    Kauffman et al.
7,222,421 B2 *    5/2007    Nakamura ............. 29/830
(Continued)

FOREIGN PATENT DOCUMENTS

JP    2007-165513    6/2007
KR    10-0704919    4/2007

OTHER PUBLICATIONS

Korean Office Action issued Aug. 13, 2010 in corresponding Korean Patent Application No. 10-2008-0124154.
(Continued)

*Primary Examiner* — Carl Arbes

(57) ABSTRACT

A method of manufacturing a printed circuit board, including: applying a dry film on a carrier and then patterning the dry film to form holes for forming metal bumps; forming an upper circuit layer including metal bumps charged in the holes and connection pads on the dry film; forming an insulation layer on the dry film; forming a build-up layer including a lower circuit layer on the insulation layer; removing the carrier; and removing the dry film.

5 Claims, 14 Drawing Sheets

(51) Int. Cl.
*H05K 3/10* (2006.01)
*H05K 3/20* (2006.01)

(56) References Cited

U.S. PATENT DOCUMENTS

| | | |
|---|---|---|
| 7,594,317 B2 | 9/2009 | Nakamura |
| 7,696,613 B2 | 4/2010 | Nakamura et al. |
| 7,716,826 B2 | 5/2010 | Nakamura |
| 8,207,450 B2 * | 6/2012 | An et al. .................. 174/261 |
| 2005/0155222 A1 * | 7/2005 | Nakamura .................. 29/830 |
| 2007/0057363 A1 * | 3/2007 | Nakamura et al. ............ 257/698 |
| 2009/0283302 A1 * | 11/2009 | Lee et al. .................. 174/255 |
| 2010/0147559 A1 | 6/2010 | Kim et al. |

OTHER PUBLICATIONS

U.S. Patent Restriction Requirement mailed May 11, 2011 in corresponding U.S. Appl. No. 12/382,360.
U.S. Patent Office Action mailed Jun. 30, 2011 in corresponding U.S. Appl. No. 12/382,360.
U.S. Patent Office Action, mailed Aug. 1, 2011 in corresponding U.S. Appl. No. 12/382,360.
U.S. Patent Final Office Action, mailed Nov. 18, 2011 in corresponding U.S. Appl. No. 12/382,360.
U.S. Patent Notice of Allowance, mailed Feb. 28, 2012 in corresponding U.S. Appl. No. 12/382,360.
U.S. Appl. No. 12/382,360, filed Mar. 13, 2009, Jin Yong An et al., Samsung Electro-Mechanics Co., Ltd.

* cited by examiner

METHOD OF MANUFACTURING PRINTED CIRCUIT BOARD WITH METAL BUMP

CROSS-REFERENCE TO RELATED APPLICATIONS

This application is a U.S. divisional application filed under 37 CFR 1.53(b) claiming priority benefit of U.S. Ser. No. 12/382,360 filed in the United States on Mar. 13, 2009, which claims earlier priority benefit to Korean Patent Application No. 10-2008-0124154 filed with the Korean Intellectual Property Office on Dec. 8, 2008, the disclosure of which are incorporated herein by reference.

BACKGROUND

1. Field

The present invention relates to a printed circuit board comprising a metal bump and a method of manufacturing the same, and, more particularly, to a printed circuit board comprising metal bumps, the metal bumps having constant diameters and arranged at fine pitches, and a method of manufacturing the same.

2. Description of the Related Art

With the advancement of electronics industry, electronic parts have become highly functionalized, and thus a package (PKG) is required to be miniaturized and highly-densified. Further, an interposer (substrate) for connecting an IC to a main board is also required to be highly-densified. The densification of the package is caused by the increase in the number of I/Os, and methods of connecting the package with the interposer have improved. Currently, as a method of mounting an IC in a high-density package, a wire bonding method and a flip bonding method are used. Among them, the flip bonding method may be used due to the costs required to mount the IC when the number of I/Os is increased.

FIG. 1 is of sectional views showing a conventional process of manufacturing a substrate on which a semiconductor chip is mounted.

First, as shown in FIG. 1A, a carrier 1 formed of a double-sided copper clad laminate is provided, and then, as shown in FIG. 1B, a solder resist 3 is applied on the carrier 1, and then, as shown in FIG. 1C, a dry film 5 is applied on the solder resist 3 and then patterned. Thereafter, as shown in FIG. 1D, electrolytic plating is conducted, and then, as shown in FIG. 1E, the dry film 5 is removed to form connection pads 7. Subsequently, as shown in FIG. 1F, a first insulation layer 9 is formed on the connection pads 7 and the solder resist 3, and then, as shown in FIG. 1G, a first circuit layer 11 is formed.

Thereafter, as shown in FIG. 1H, a build-up layer 13 is additionally formed by repeating the above processes, and then, as shown in FIG. 1I, a solder resist 15 is applied on the build-up layer 13.

Subsequently, as shown in FIG. 1J, the carrier 1 is separated by conducting a routing process, and then, as shown in FIG. 1K, copper foil is etched and removed. Then, as shown in FIG. 1L, the solder resists 3 and 15 are patterned to form openings 17 for exposing the connection pads 7.

Thereafter, as shown in FIG. 1M, solder balls 19 for flip chip bonding are formed in the openings 17. The formation of the solder balls 9 is conducted through a solder paste printing process using screen printing and a reflow process.

However, as described above, the method of forming a bump on a printed circuit board using a printing process is problematic in that large connection pads are required, and thus it is difficult to realize bump arranged at fine pitches of 120 μm or less.

Further, the method of forming a bump on a printed circuit board using a printing process is problematic in that a fine bump is not formed, or its volume is very small even though the fine bump is formed.

Further, in the method, since the connection pads are formed by plating, their thicknesses are different from each other due to plating deviation, and, since solder paste cannot be easily printed in a completely uniform manner even in the solder paste printing process, the heights of solder balls are not uniform, so that there is a problem in that solder balls which are not connected to a semiconductor chip are formed.

Further, in the method, since the stepped portion of the solder resist 15 is large, there is a problem in that voids are formed in an underfill process performed after the mounting of an electronic part.

SUMMARY

Accordingly, the present invention has been made to solve the above conventional problems, and the present invention provides a printed circuit board comprising metal bumps, the metal bumps arranged at fine pitches and uniform diameter and height, and a method of manufacturing the same.

An aspect of the present invention provides a printed circuit board, including: an upper circuit layer including connection pads made of a conductive metal and buried in an insulation layer; and metal bumps, each having a constant diameter, which are integrated with the connection pads and protrude over the insulation layer.

In the printed circuit board, each of the connection pads may have an exposed surface being flush with a surface of the insulation layer.

The insulation layer may be made of a solder resist.

The printed circuit board may further include a connection metal layer formed on the metal bumps.

The printed circuit board may further include a build-up layer including a lower circuit layer disposed beneath the insulation layer.

The lower circuit layer may include lower connection pads, and the printed circuit board may further include a solder resist layer covering the lower circuit layer and having openings for exposing the lower connection pads.

Another aspect of the present invention provides a method of manufacturing a printed circuit board, including: applying a dry film on a carrier and then patterning the dry film to form holes for forming metal bumps; forming an upper circuit layer including metal bumps charged in the holes and connection pads on the dry film; forming an insulation layer on the dry film; forming a build-up layer including a lower circuit layer on the insulation layer; removing the carrier; and removing the dry film.

In the method, the forming of the upper circuit layer may include: forming a seed layer on the holes and the dry film; patterning the seed layer to form openings for forming the upper circuit layer, including openings for forming the connection pads, the openings exposing the holes; plating the openings for forming the upper circuit layer to form the upper circuit layer including the metal bumps and the connection pads; and removing the seed layer.

The method may further include: forming a solder resist layer on the lower circuit layer after the forming of the build-up layer.

In the method, the removing of the carrier may include: separating a metal foil constituting an outer layer of the carrier from the carrier; and removing the metal foil from the dry film.

The method may further include: forming a connection metal layer on bottoms of the holes after the applying of the dry film.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF EMBODIMENTS

Figure 1A:
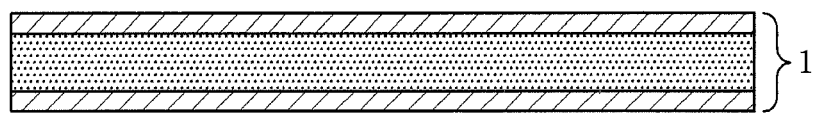
FIGS. 1A to 1M are sectional views showing a conventional process of manufacturing a substrate on which a semiconductor chip is mounted.
Figure 1B:
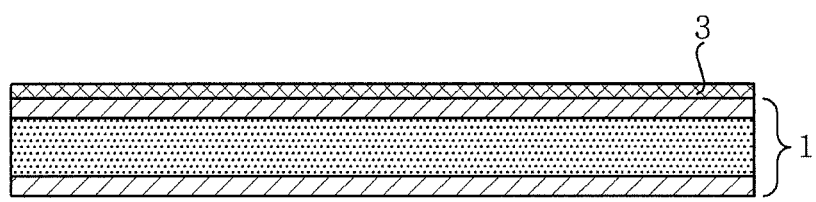
Figure 1C:
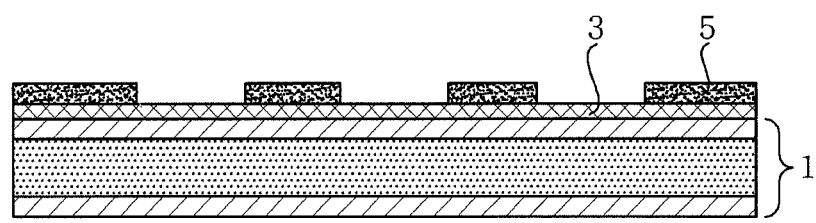
Figure 1D:
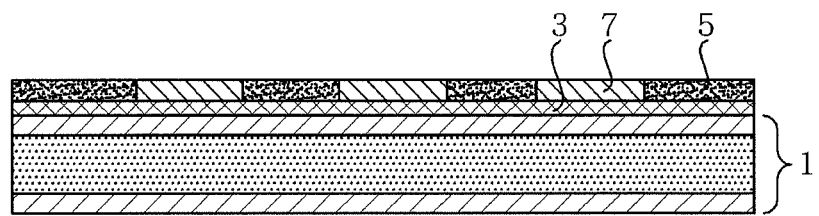
Figure 1E:
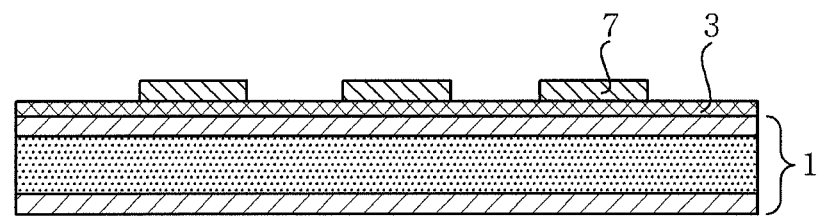
Figure 1F:
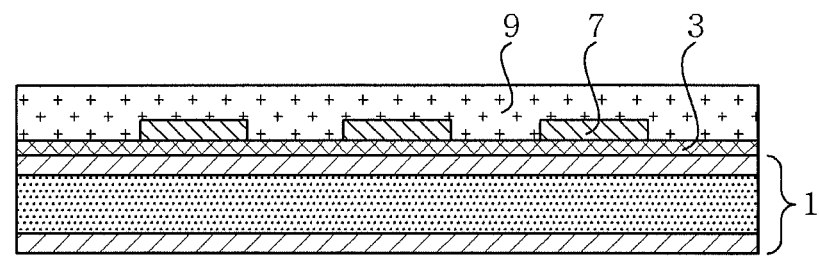
Figure 1G:
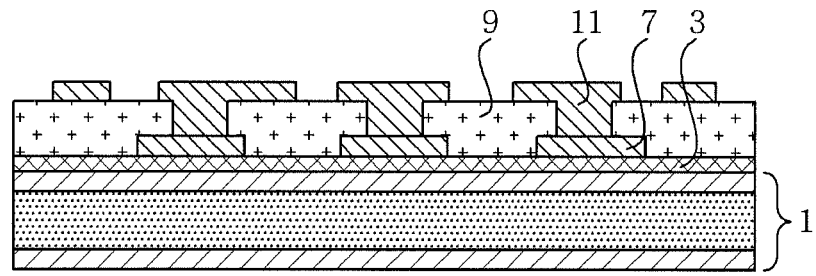
Figure 1H:
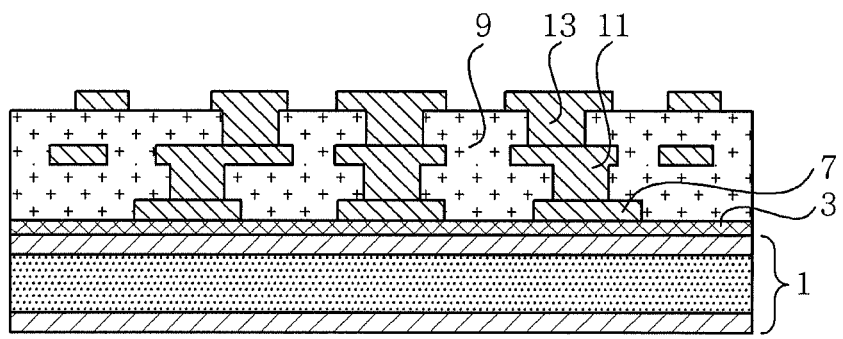
Figure 1I:
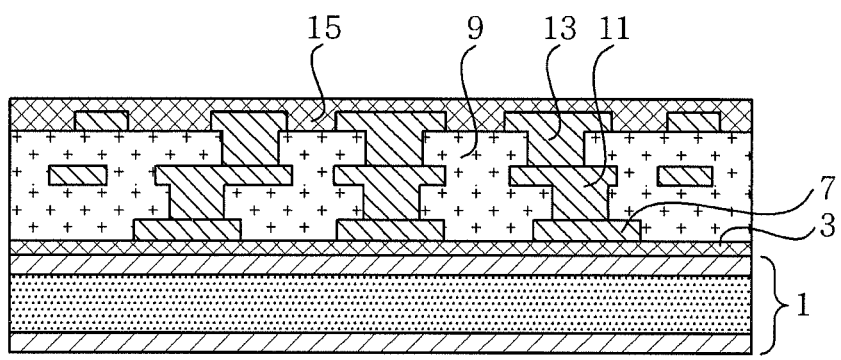
Figure 1J:
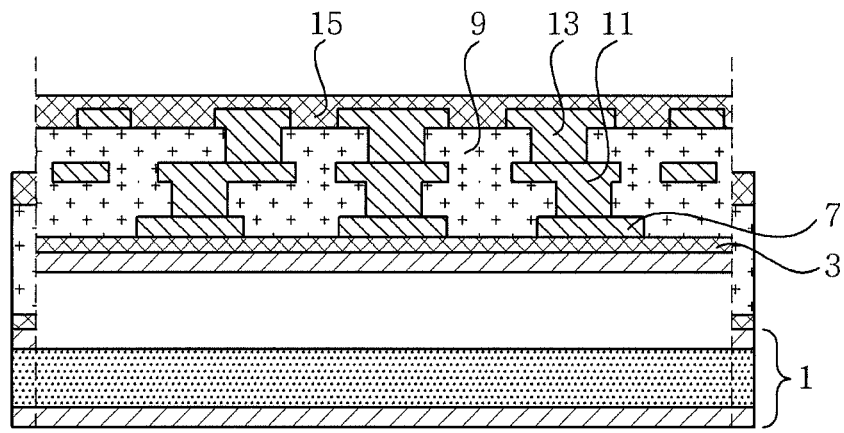
Figure 1K:
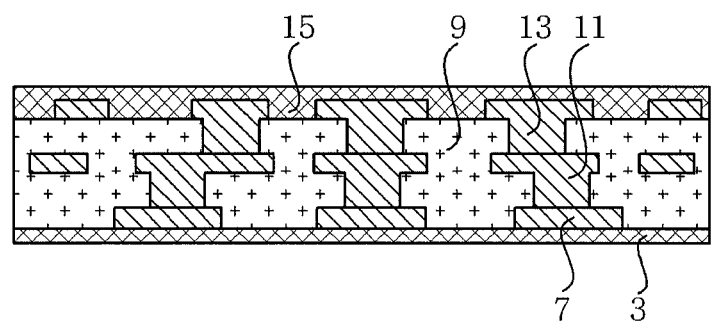
Figure 1L:
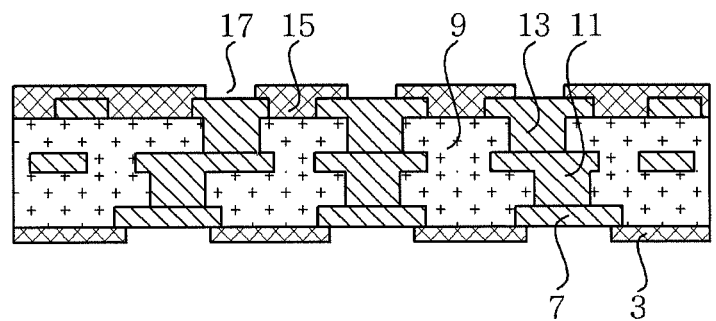
Figure 1M:
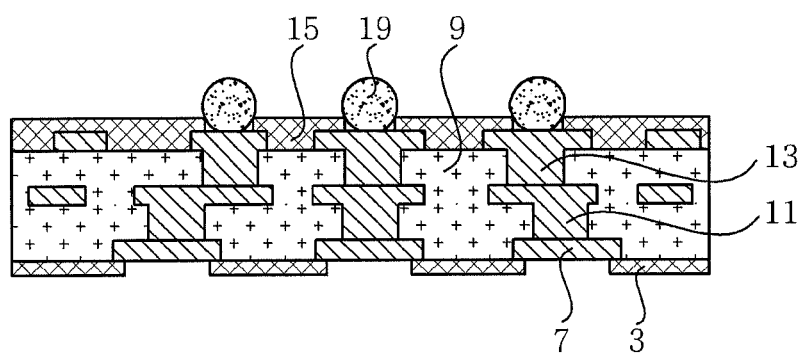

Hereinafter, preferred embodiments of the present invention will be described in detail with reference to the attached drawings.

Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 11:
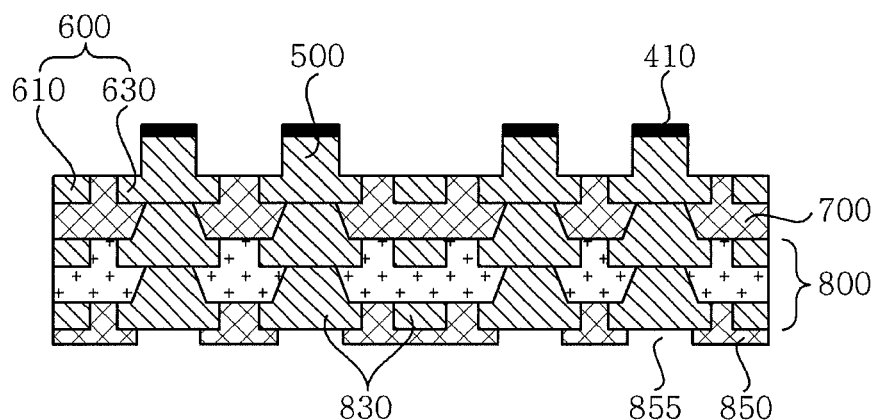

FIG. 11 is a sectional view showing a printed circuit board including a metal bump according to an embodiment of the present invention. As shown in FIG. 11, the printed circuit board according to an embodiment of the present invention includes an upper circuit layer 600 including connection pads 630 buried in an insulation layer 700 and made of a conductive metal; and metal bumps 500, having constant diameters, which are integrated with the connection pads 630 and protrude over the insulation layer 700.

The insulation layer 700 may be a solder resist layer, and may be made of a composite polymer resin which is generally used as an interlayer insulation material. For example, the insulation layer 700 may be made of prepreg, or an epoxy resin such as FR-4, BT (Bismaleimide Triazine), ABF (Ajinomoto Build up Film) or the like, but the present invention is not limited thereto.

The metal bumps 500 protrude over the insulation layer 700, and function to electrically connect an electronic part to be mounted in the printed circuit board later with wires formed in the printed circuit board. The metal bumps 500 are integrated with the connection pads 630 buried in the insulation layer 700, and are made of the same material as the connection pads 630. Therefore, the metal bumps 500 are not completely distinct from the connection pad 630, but the metal bumps 500 have diameters smaller than those of the connection pads 630 and protrude over the insulation layer 700. In this embodiment, each of the metal bumps 500 has a post shape in which its upper diameter is the same as its lower diameter. Here, the meaning that the metal bump 500 has a constant diameter does not mean that the upper and lower diameters of the metal bump 500 are mathematically exactly equal to each other but means that a slight change in diameter of the metal bump 500 due to the errors occurring in a substrate manufacturing process is allowed.

In this case, a connection metal layer 410 may further be formed on the metal bumps 500. The connection metal layer 410 may be made of a conductive metal such as tin (Sn), an alloy of tin (Sn) and silver (Ag) or the like.

The upper circuit layer is buried in the insulation layer 700, and includes the connection pads 630 integrated with the metal bumps 500. In this embodiment, the connection pads 630 are buried in the insulation layer 700, but they have exposed surfaces which are exposed to the outside of the insulation layer 700. Here, the exposed surfaces are surfaces of the connection pads 630 which are not covered by the insulation layer 700, and are not surfaces which are exposed to the outside of another insulation layer or a solder resist layer which can be formed on the insulation layer 700. In this embodiment, the exposed surfaces of the connection pads 630 are flush with the surface of the insulation layer 700. The connection pads may be made of a conductive metal such as gold, silver, copper, nickel or the like.

Meanwhile, in this embodiment, only the upper structure of the printed circuit board, which is a characteristic structure of the present invention, is described, but the printed circuit board according to the embodiment of the present invention further includes a build-up layer 800 which is disposed beneath the insulation layer 700 and includes a lower circuit layer 830 electrically connected to the upper circuit layer 600. The build-up layer 800 may further include an inner circuit layer 810 (refer to FIG. 7) formed between the upper circuit layer 600 and the lower circuit layer 830. In this embodiment, only a single inner circuit layer 810 is exemplified, but the number of inner circuit layers 810 is not limited thereto. It is easily understood by those skilled in the art that, if necessary, the number of the inner circuit layers 810 can be controlled.

In this case, the lower circuit layer 830 may include lower connection pads, and may further include a solder resist layer 850 covering the lower circuit layer 830 and having openings 855 for exposing the lower connection pads.

According to the above printed circuit board, since the printed circuit board includes the post-shaped metal bumps 500 having excellent electric conductivity, the printed circuit board can be easily connected electrically to an electronic part mounted therein.

Further, the above printed circuit board is advantageous in that the printed circuit board includes metal bumps 500 arranged at fine pitches because the metal bumps 500 have constant diameters, the lower diameters of which are not larger than the upper diameters thereof.

Furthermore, the above printed circuit board is advantageous in that voids are not formed in an underfill process because the height of the insulation layer is the same as the height of the connection pads and thus a stepped portion is not formed therebetween.

FIGS. 2 to 11 are sectional views showing a method of manufacturing a printed circuit board including a metal bump according to an embodiment of the present invention. Hereinafter, the method of manufacturing a printed circuit board including a metal bump according to an embodiment of the present invention will be described with reference to FIGS. 2 to 11.

First, a process of applying a dry film 310 on a carrier 100 and then patterning the dry film 310 to form holes 315 for forming metal bumps 500 will be described. In this embodiment, for example, a process of placing a printed circuit board on one side of the carrier 100 is described, but a process of placing a printed circuit board on both sides of the carrier 100 may be conducted.

Figure 2:
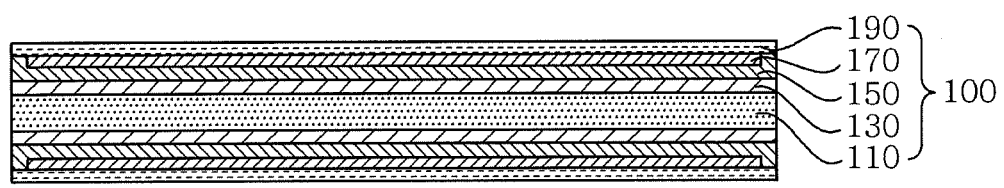
FIGS. 2 to 11 are sectional views showing a method of manufacturing a printed circuit board including a metal bump according to an embodiment of the present invention.

As shown in FIG. 2, in order to prevent a printed circuit board from warping during processing, a carrier 100, functioning as a support, is provided. For example, the carrier 100 has a structure in which insulation material layers 150 and release layers 170 are sequentially formed on both sides of a double-sided copper clad laminate in which copper foil layers 130 are formed on both sides of an insulation resin layer 110.

In this case, in order to increase the strength of the double-sided copper clad laminate, the insulation resin layer 110 contains a glass material, and may have a thickness of about 100~800 μm.

Further, the release layer 170 has a length and an area smaller than those of the copper foil layer 130, and may be formed on the insulation material layer 150, but not on the lateral sides of the copper foil layer 130. The release layer serves to easily separate metal foil 190 from the carrier 100 in the latter half of a process of manufacturing a printed circuit board. Meanwhile, the release layer 170 may be formed by applying a releasing material on the insulation material layer 150 in the form of thin film or sputtering the releasing material on the insulation material layer 150. The metal foil 190, which is bound by a portion of the insulation material layer 150 on which the release layer 170 is not formed, is applied on the carrier 100. The metal foil 190 may be made of a conductive metal such as copper (Cu), gold (Au), silver (Ag) or the like. In this embodiment, copper foil is used as the metal foil 190.

Figure 3:
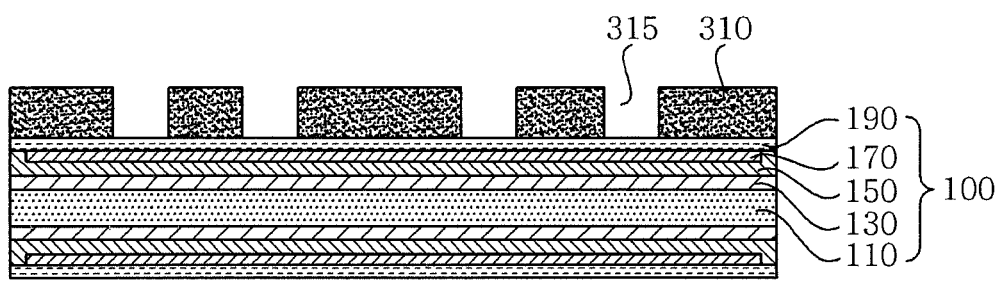

Thereafter, as shown in FIG. 3, a dry film 310 is applied on the carrier 100 and then patterned to form holes 315 for forming metal bumps 500. As the dry film 310, a photosensitive dry film may be used. The patterning of the dry film 310 may be performed by selectively exposing and curing the applied dry film 310 using a mask (not shown) having light shielding patterns and then removing the uncured portion of the dry film 310.

Figure 4:
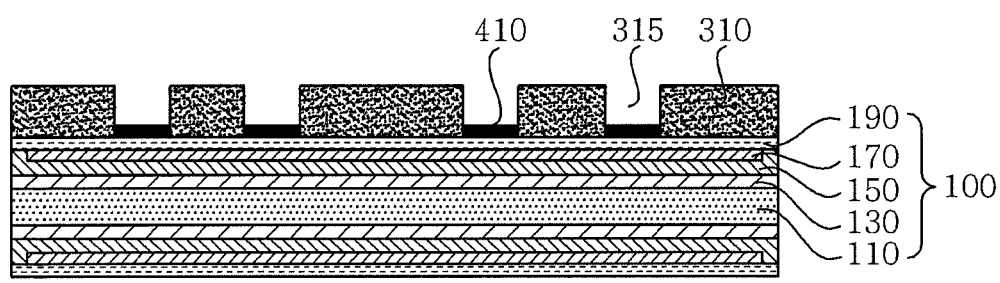

Subsequently, as shown in FIG. 4, a connection metal layer 410 is formed on the bottoms of the holes 315. The formation of the connection metal layer 410 may be optional. The connection metal layer 410 may be formed using the metal foil 190 as a lead wire by electrolytic plating. The connection metal layer 410 serves to protect the upper ends of the metal bumps 500 to be connected to an electronic part later and serve to smoothly perform the electrical connection of the electronic part and the metal bumps 500. The connection metal layer 410 may be made of a conductive metal such as tin (Sn), an alloy of tin (Sn) and silver (Ag) or the like. The connection metal layer 410 may be made of a metal which causes the copper foil formed on the carrier 100 to be selectively etched with respect to the connection metal layer 410.

Figure 5:
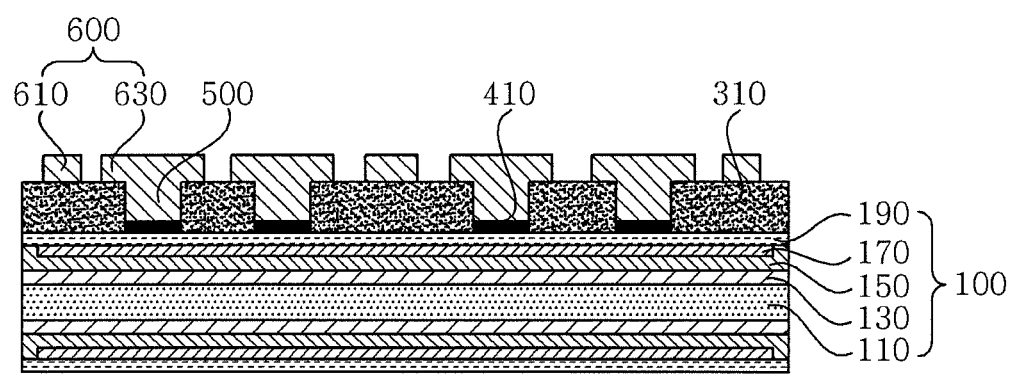

Next, as shown in FIG. 5, a process of forming an upper circuit layer 600 including metal bumps 500 charged in the holes 315 and connection pads 630 on the dry film 310 will be described. First, a seed layer (not shown) is formed on the dry film 310 and the inner surfaces of the holes. Subsequently, a plating resist (not shown) made of a photosensitive material is placed on the seed layer, and then the seed layer is patterned to form openings for forming the upper circuit layer 600, including openings for forming the connection pads 630, these openings exposing the holes 315. Subsequently, the upper circuit layer 600 including metal bumps 500 charged in the holes 315 and the connection pads 630 can be formed by electroplating the openings through a general SAP process. Then, the exposed portion of the seed layer is removed by flash etching or quick etching. In this case, the upper circuit layer may selectively include circuit patterns 610. It can be easily understood that whether or not the circuit patterns 610 are formed can be determined by the patterning type of the plating resist.

In this case, the diameters of the holes formed by patterning the dry film 310 through exposure and development are constant. For this reason, it is possible to form the metal bumps 500 having a constant diameter, that is, having a post shape, lateral sides of which are not tapered. Here, the meaning that the metal bump 500 has a constant diameter does not mean that the upper and lower diameters of the metal bump 500 are mathematically exactly equal to each other but means that a slight change in diameters of the metal bumps 500 due to the errors occurring in a substrate manufacturing process is allowed. Further, it can be understood that the metal bumps 500 may be formed to have a height corresponding to the thickness of the dry film 310.

Figure 6:
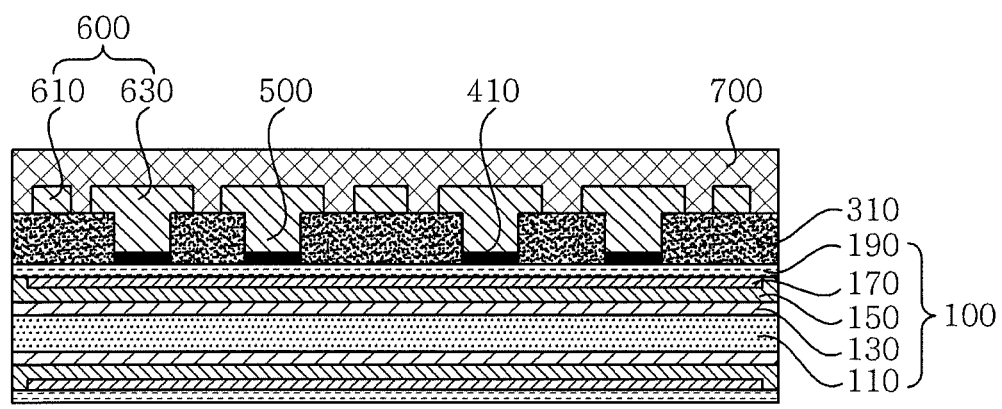

Next, as shown in FIG. 6, a process of forming an insulation layer 700 on the dry film 310 will be described. The insulation layer 700 may be a solder resist layer, and may be made of a composite polymer resin which is generally used as an interlayer insulation material. For example, the insulation layer 700 may be made of prepreg, or an epoxy resin such as FR-4, BT (Bismaleimide Triazine), ABF (Ajinomoto Build up Film) or the like, but the present invention is not limited thereto.

Figure 7:
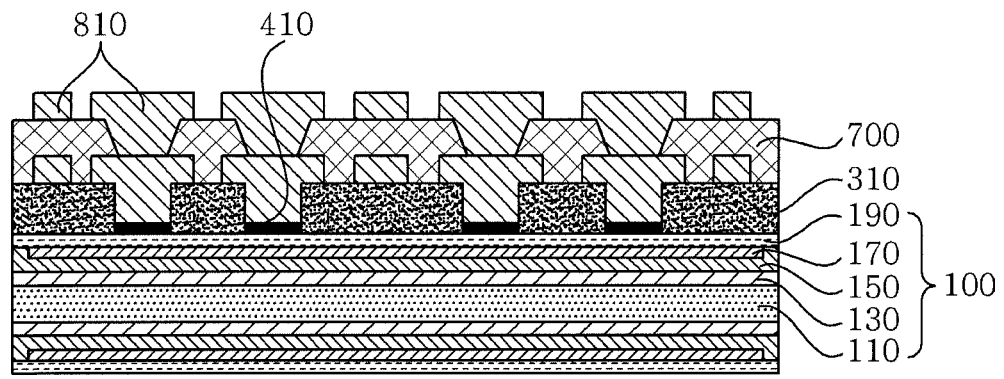
Figure 8:
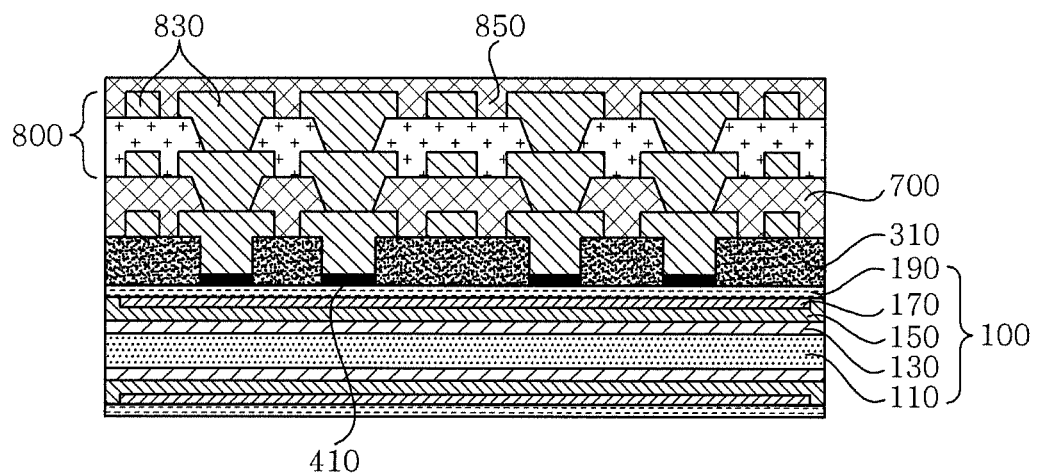

Next, as shown in FIGS. 7 and 8, a process of forming a build-up layer 800 including a lower circuit layer 830 on the insulation layer 700 will be described. In this process, via holes are formed in the insulation layer 700 using a YAG laser drill or a CO2 laser drill, and then an inner circuit layer 810 is formed through a semi-additive process, and then the lower circuit layer 830 is formed by repeating the above processes. In this embodiment, a process of forming a build-up layer including one inner circuit layer is exemplified, but the present invention is not limited thereto. The number of the inner circuit layers 810 is not limited, and the inner circuit layer 810 may not exist. When the lower circuit layer 830 is completed, a solder resist layer 850 for covering the lower circuit layer 830 is formed on the lower circuit layer 830.

Figure 9:
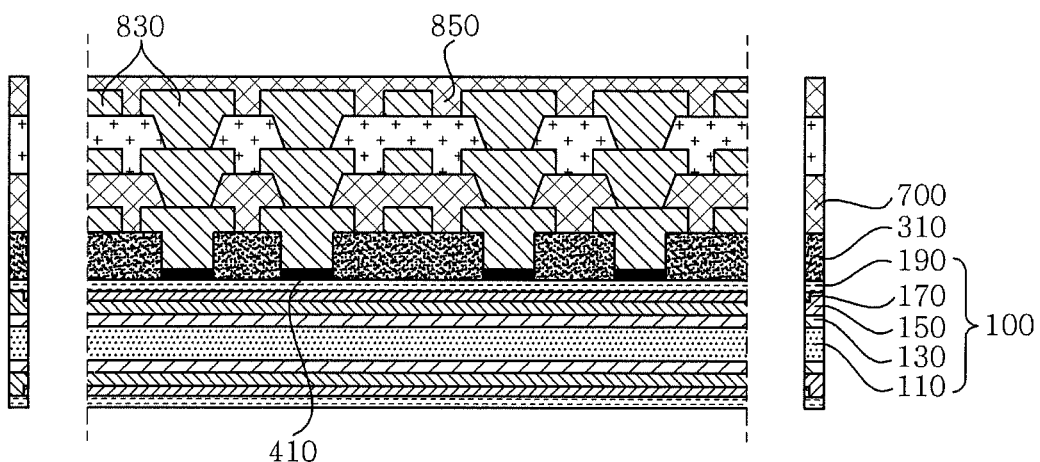

Next, as shown in FIG. 9, a process of removing the carrier 100 will be described. In this process, the lateral portions of the carrier 100 and the printed circuit board placed on the carrier 100 may be cut through a routing process, and the metal foil 190 constituting an outer layer of the carrier 100 may be separated from the carrier 100. Here, the routing process is a process of performing mechanical cutting using a routing bit. In the routing process, the lateral portions of the carrier 100 and the printed circuit board are cut and removed, and thus the insulation material layer 150 binding the metal foil 190 applied on the carrier 100 is also removed, thereby separating the metal foil 190 and the printed circuit board from the carrier 100. Then, the metal foil is removed from the dry film 310 through an etching process.

Figure 10:
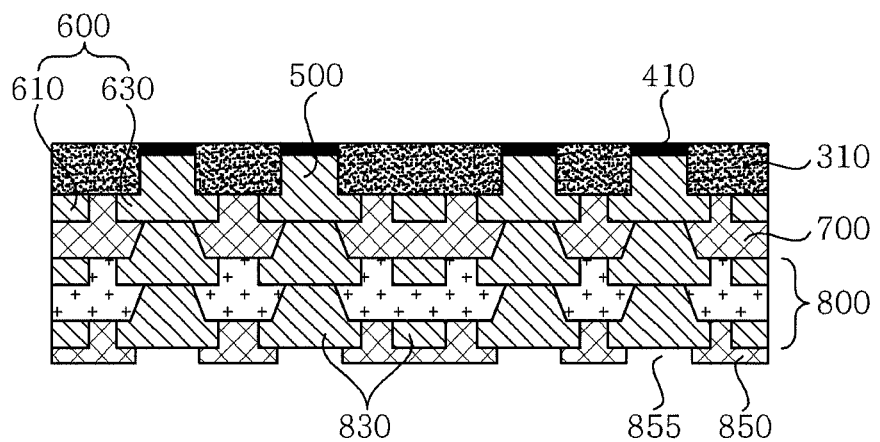

Subsequently, as shown in FIG. 10, openings 855 for exposing lower connection pads formed in the lower circuit layer 830 are formed in the solder resist layer 850.

Subsequently, as shown in FIG. 11, the dry film 310 is removed using a stripping agent.

Thereafter, a surface protection layer may be formed on the exposed surfaces of the metal bumps 500 and the connection pads 630. For example, the surface protection layer can be formed by performing an OSP process or by performing a nickel or gold plating process.

According to the above process of manufacturing a printed circuit board, since the dry film 310 is formed on the carrier 100 and then metal bumps are formed, a printed circuit board including post-shaped metal bumps having constant heights and excellent electric conductivity can be manufactured.

Further, according to the above process of manufacturing a printed circuit board, since the metal bumps 500 are formed by charging a metal into the holes 315 having constant diameters and formed in the dry film 310 through a plating process, metal bumps having constant diameters can be formed, and thus metal bumps arranged at fine pitches can also be formed.

FIGS. 12 to 22 are sectional views showing a method of manufacturing a printed circuit board including a metal bump according to another embodiment of the present invention. Hereinafter, the method of manufacturing a printed circuit board including a metal bump according to another embodiment of the present invention will be described with reference to FIGS. 12 to 22. Here, parts of the description overlapping with the above embodiment are omitted.

Figure 12:
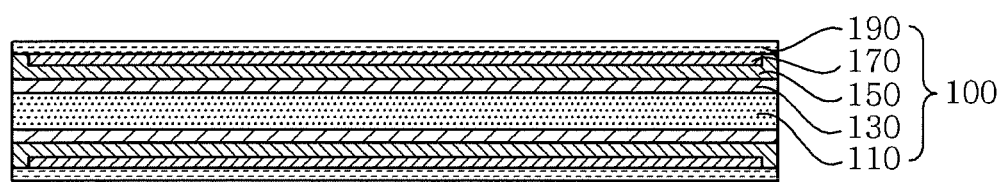
FIGS. 12 to 22 are sectional views showing a method of manufacturing a printed circuit board including a metal bump according to another embodiment of the present invention.

First, as shown in FIG. 12, a carrier 100 coated with metal foil 190 is provided.

Figure 13:
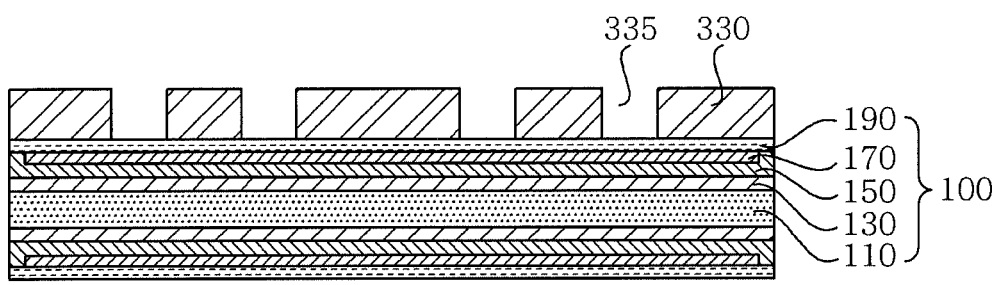

Subsequently, as shown in FIG. 13, a metal layer 330 including holes 335 for forming metal bumps 500 is formed on the metal foil 190. The metal layer 330 may be formed by forming a photosensitive plating resist layer (not shown) on the metal foil 190 and patterning the photosensitive plating resist layer using the metal foil 190 as a lead wire through electrolytic plating. The metal layer 330 may be made of a conductive metal. In this embodiment, the metal layer 330 is made of copper (Cu).

Figure 14:
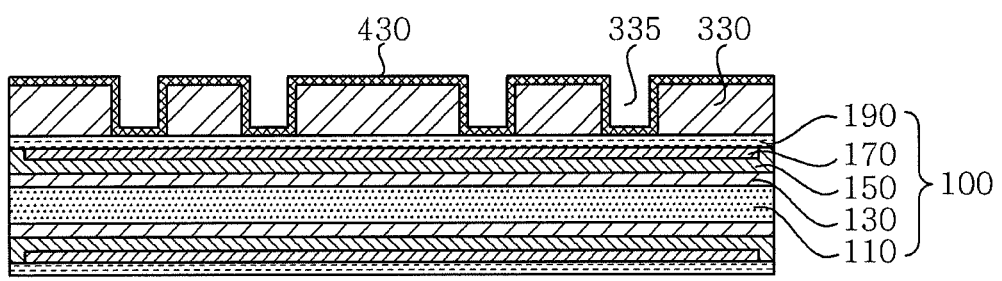

Subsequently, as shown in FIG. 14, a barrier layer 430, serving as an etching inhibiting layer, is formed on the metal layer 330 and the inner surfaces of the holes. The barrier layer 430 may be formed by electroless plating or electrolytic plating. In this case, the barrier layer 430 may be made of a metal which has selective etchability with respect to the metal layer 330 and the metal bumps 500 and upper circuit layer 600 to be formed later. In this embodiment, the barrier layer 430 is made of nickel (Ni).

Figure 15:
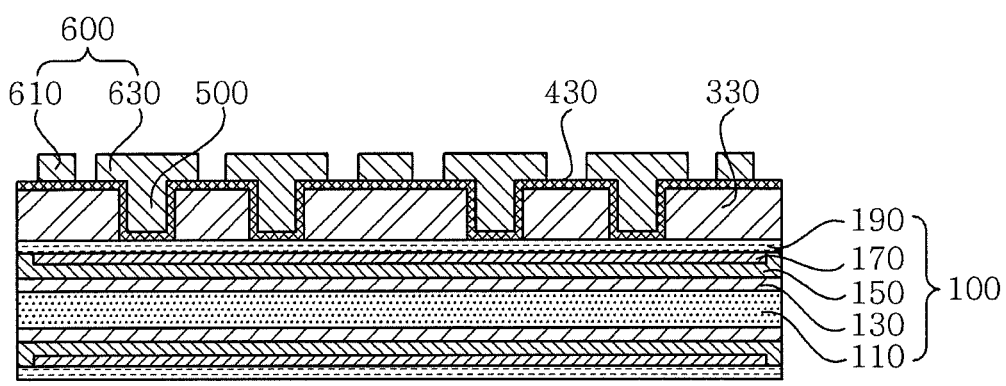
Figure 16:
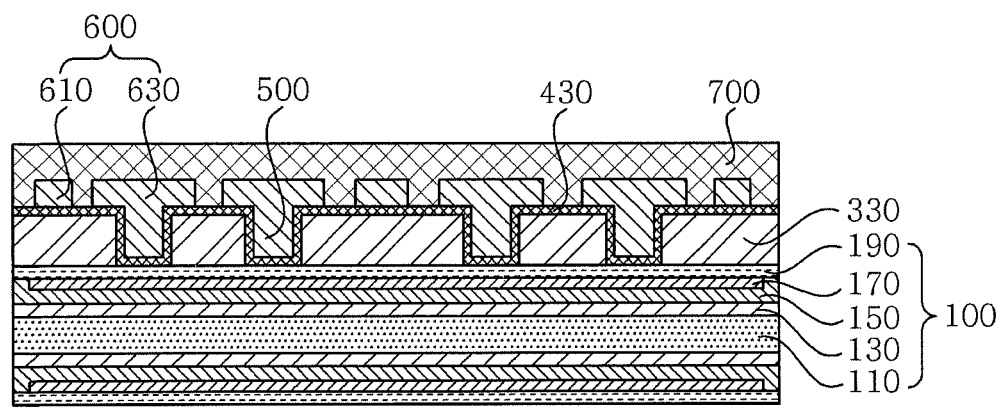

Subsequently, as shown in FIG. 15, metal bumps 500 are formed in the holes 335 and an upper circuit layer 600 is formed on the barrier layer 430, and then, as shown in FIG. 16, an insulation layer 700 is formed on the upper circuit layer 600.

Figure 17:
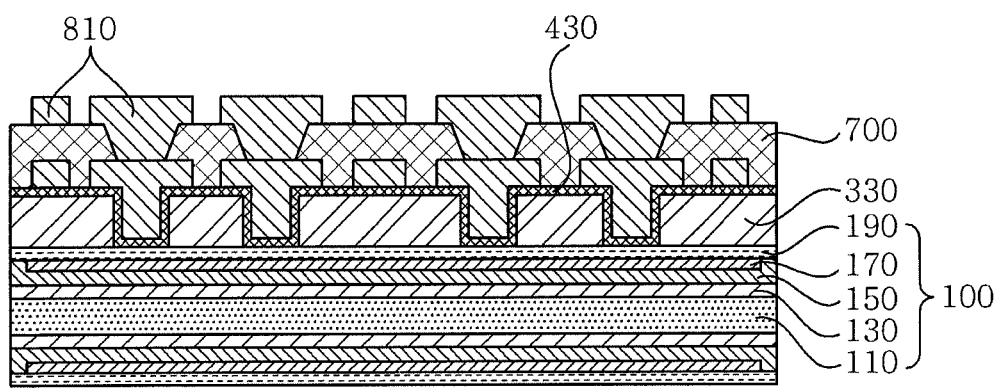
Figure 18:
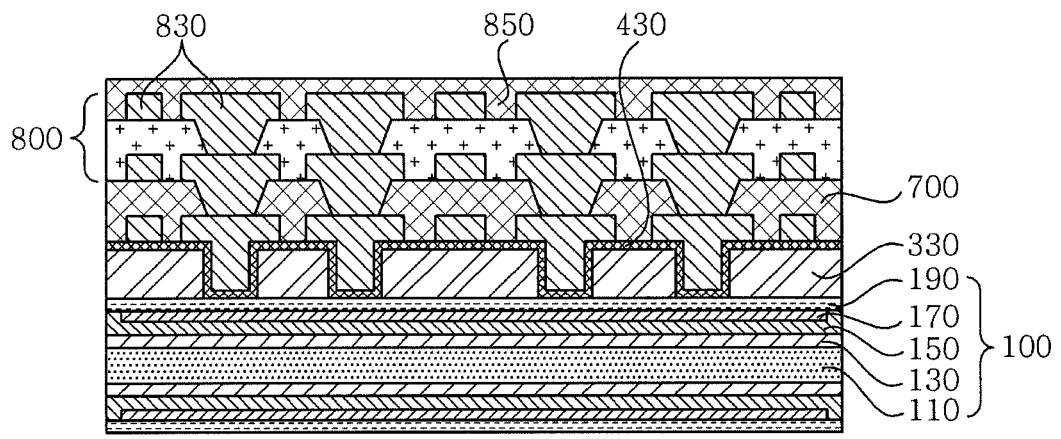

Subsequently, as shown in FIGS. 17 and 18, an inner circuit layer 810 and a lower circuit layer 830 are sequentially formed on the insulation layer 700, and then a solder resist layer 850 is formed on the lower circuit layer 830.

Figure 19:
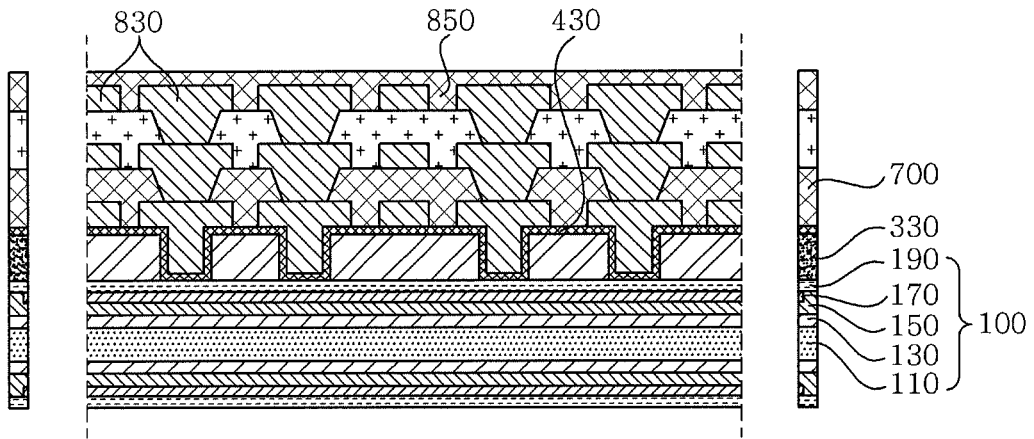

Subsequently, as shown in FIG. 19, the metal foil 190 is separated from the carrier 190 and then removed.

Figure 20:
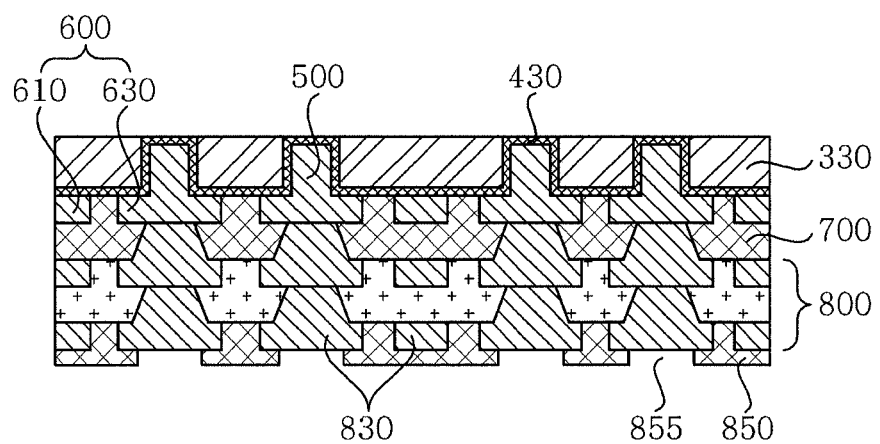

Subsequently, as shown in FIG. 20, openings 855 for exposing lower connection pads formed in the lower circuit layer 830 are formed in the solder resist layer 850.

Figure 21:
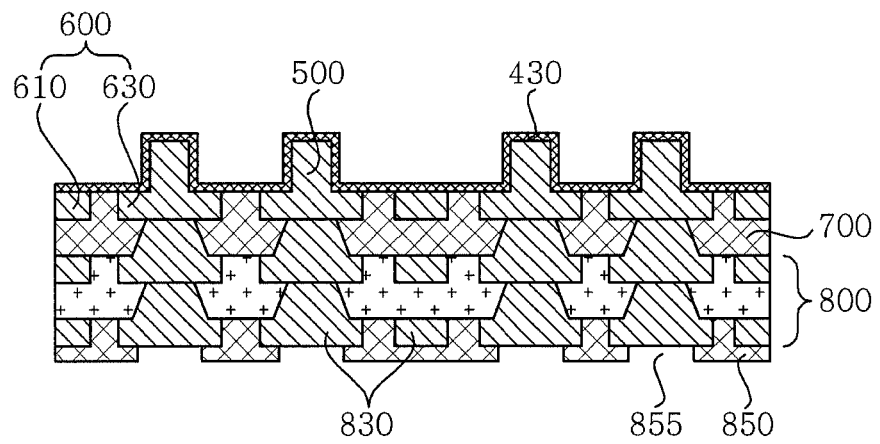
Figure 22:
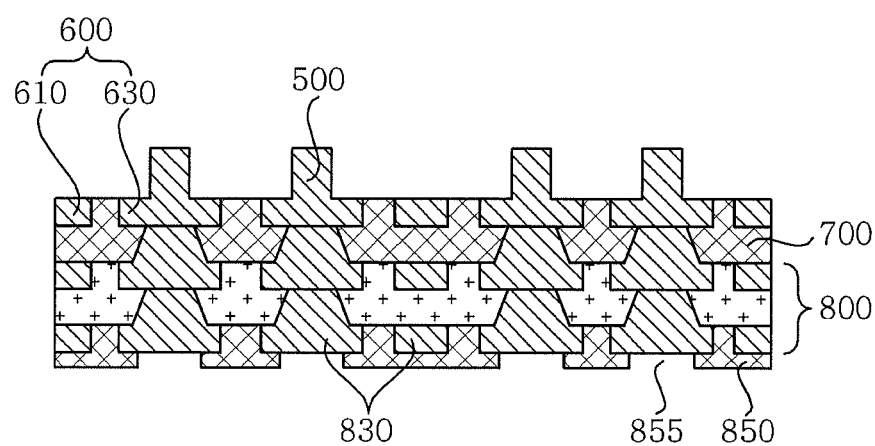

Subsequently, as shown in FIG. 21, the metal layer 330 is etched and thus removed, and then, as shown in FIG. 22, the barrier layer 430 is removed. The barrier layer 430 may be removed using a nickel selective etchant. The barrier layer 430 and the upper circuit layer 600 may be made of metals, one of which has a selective etchability with respect to the other. The barrier layer 430 can be removed without damaging the upper circuit layer 600.

As described above, the printed circuit board according to the present invention is advantageous in that the printed circuit board can be easily connected electrically to an electronic part mounted therein because the printed circuit board includes post-shaped metal bumps having excellent electric conductivity. Further, the printed circuit board according to the present invention is advantageous in that the printed circuit board includes metal bumps arranged at fine pitches because the metal bumps have constant diameters, the lower diameters of which are not larger than the upper diameters thereof.

According to the process of manufacturing a printed circuit board according to the present invention, since a dry film is formed on a carrier and then metal bumps are formed, a printed circuit board including post-shaped metal bumps having constant heights and excellent electrical conductivity can be manufactured.

Further, according to the process of manufacturing a printed circuit board of the present invention, since metal bumps 500 are formed by charging a metal into holes having constant diameters and formed in a dry film through a plating process, metal bumps having constant diameters can be formed, and thus metal bumps arranged at fine pitches can also be formed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board, comprising:
    applying a dry film on a carrier and then patterning the dry film to form holes for forming metal bumps;
    forming an upper circuit layer including metal bumps charged in the holes and connection pads on the dry film;
    forming an insulation layer on the dry film;
    forming a build-up layer including a lower circuit layer on the insulation layer;
    removing the carrier; and
    removing the dry film such that each of the connection pads has an exposed surface flush with a surface of the insulation layer.

2. The method according to claim 1, wherein the forming of the upper circuit layer comprises:
    forming a seed layer on the holes and the dry film;
    patterning the seed layer to form openings for forming the upper circuit layer, including openings for forming the connection pads, the openings exposing the holes;
    plating the openings for forming the upper circuit layer to form the upper circuit layer including the metal bumps and the connection pads; and
    removing the seed layer.

3. The method according to claim 1, after forming the build-up layer, further comprising:
    forming a solder resist layer on the lower circuit layer after the forming of the build-up layer.

4. The method according to claim 1, wherein the removing of the carrier comprises:
    separating a metal foil constituting an outer layer of the carrier from the carrier; and
    removing the metal foil from the dry film.

5. The method according to claim 1, after applying the dry film and patterning the dry film, further comprising:

forming a connection metal layer on bottoms of the holes after the applying of the dry film.

\* \* \* \* \*